Oct. 23, 1962 A. W. VINAL 3,060,325

GATE HAVING STROBE AND SIGNAL INPUT, DRIVEN TO SATURATION UPON COINCIDENCE, WITH STRETCHED OUTPUT

Filed Aug. 28, 1958

INVENTOR.
ALBERT W. VINAL

BY Ralph R Barnard

ATTORNEY 3,060,325
Patented Oct. 23, 1962

3,060,325

GATE HAVING STROBE AND SIGNAL INPUT, DRIVEN TO SATURATION UPON COINCIDENCE, WITH STRETCHED OUTPUT

Albert W. Vinal, Owego, N.Y., assignor to International Business Machines Corporation, New York, N.Y., a corporation of New York Filed Aug. 28, 1958, Ser. No. 757,803
7 Claims. (Cl. 307—88.5)

Figure 1:
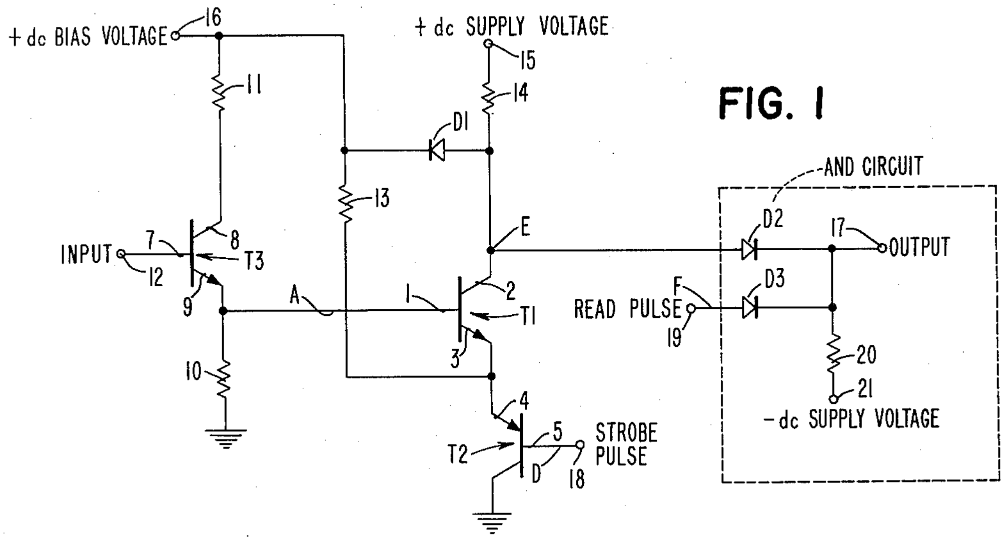

The present invention relates to electronic detection and amplification means and more particularly to a new and improved means for strobing, amplifying and stretching an electrical waveform.

In electronic pulse circuitry, as exemplified by digital computers and telemetering applications, it is often desired to provide means for detecting the presence of a desired, narrow electrical pulse at one point in time and utilize this information at another point in time which may be subsequent to its availability in the input signal. Means known as stretch amplifiers have been used by the prior art for that purpose. More specifically, by using the stretch amplifier, exemplified by a conventional electronic integrating device, a desired, narrow pulse may be stretched in width so that it will be available when it is desired that it be sampled.

Problems arise, however, when the desired pulse is accompanied by electrical noise which is adjacent in time and considerably larger than the desired signal. In order to avoid this strong, adjacent electrical noise, further means may be used to strobe (sample) the electrical information at a point in time when the desired, electrical pulse signal has a more desirable signal-to-noise ratio. This technique results in difficulties because the use of prior art techniques for assuring the existence of the electrical signal at a desired read time has to be compatible with the use of a strobing (sampling) technique for avoiding the adjacent, large amplitude electrical noise.

In addition to strobing (sampling) and stretching a desired signal present within an input electrical waveform, it is often desirable in the electronic computer field that the desired signal be represented as a pulse of a predetermined width and amplitude at a readout utilization time. As a result, it is often necessary that the desired signal be amplified and shaped after it is strobed and stretched.

It is, therefore, a primary object of the present invention to provide a new and improved electronic means for strobing, amplifying and stretching an electrical waveform.

It is another object of the present invention to provide a new and improved stretching amplifier for assuring the existence of a signal at a desired readout time.

It is still another object of the present invention to provide a new and improved electronic strobing means for sampling a desired electrical pulse at a time when the signal-to-noise ratio is desirable.

It is an additional object of the present invention to provide a new and improved transistorized electronic amplifier for strobing and amplifying a signal waveform.

Other objects of the invention will be pointed out in the following description and claims and illustrated in the accompanying drawings, which disclose, by way of examples, the principle of the invention and the best mode which has been contemplated of applying that principle.

Briefly, the present invention utilizes minority carrier storage in a transistor for stretching the desired portion of an input electrical waveform in combination with further means for rendering the transistor nonresponsive to an adjacent electrical noise portion of the input electrical waveform. Additional means are provided for transforming the stretched output of the transistor into a pulse of a fixed width and amplitude at a sampling or readout time.

Figure 2:
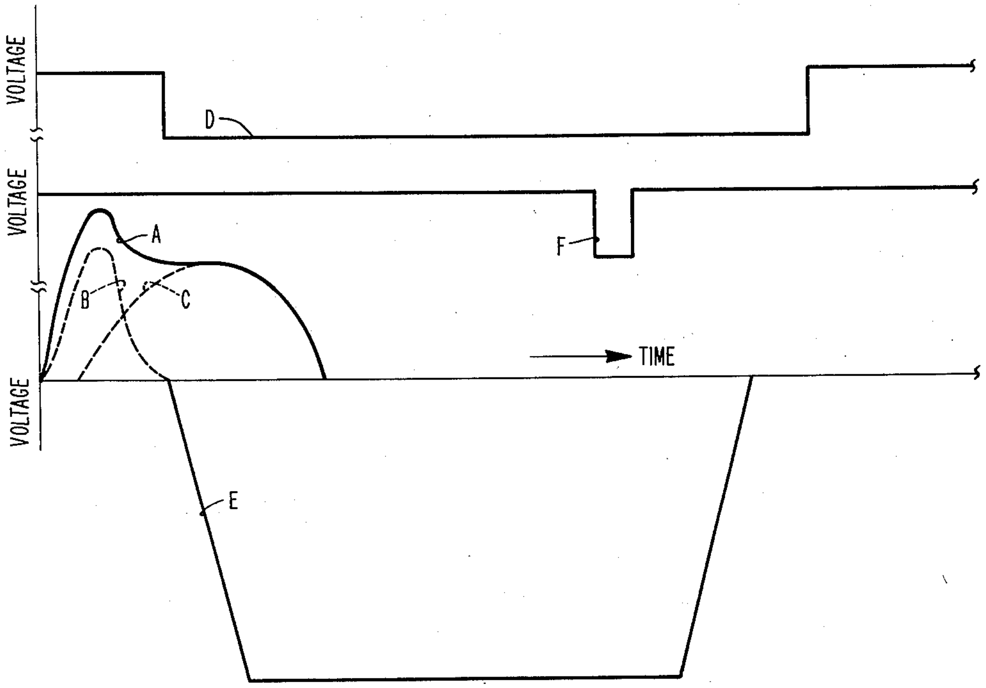

In the drawings:

FIG. 1 shows an electrical schematic of an illustrative embodiment according to the present invention; and FIG. 2 illustrates waveforms of electrical voltages appearing at selected points in the electrical schematic of FIG. 1 which will be helpful in understanding the operation of the electrical circuitry of that figure according to the present invention.

In order to assure the existence of a desired signal waveform at a point in time which may be subsequent to the availability of the source of that desired signal waveform, a stretching device may be utilized. It is a feature of the present invention to utilize the phenomenon of minority carrier storage in a semi-conductor device for that purpose. If a large forward voltage is applied across the base-emitter junction of a transistor, a saturating condition may be created so that the base region will be progressively loaded with minority carriers. These minority carriers are known as holes in PNP type transistors and free electrons in NPN type transistors. If this saturating condition lasts long enough, the entire base region will be filled with minority carriers and the transistor will be completely saturated. Simultaneously with the existence of a partial or complete saturation condition, the collector current will be heavy and the collector voltage will no longer be substantially equal to the collector voltage supply but will be decreased by an amount equal to the voltage across the collector load. As a result of minority carrier storage, the base region will not immediately return to its original state. Upon the removal of the forward biasing on the base-emitter junction, the base region will not immediately return to its original state as a result of minority carrier storage, and there will be a time delay in the collector voltage returning to the collector supply voltage level depending upon the degree of saturation within the base region. This delay is a function of the number of excess minority carriers within the base region which have to be removed before the transistor can return to its non-conducting state. Stated another way, within certain limits of time and degree of saturation, there will be a voltage pulse derived on the collector having a width which is a function of the time that the input electrical waveform applied to the base-emitter junction maintains the transistor in saturation. Within these limits, the wider the input electrical voltage waveform, the larger the time delay and the wider the voltage pulse derived on the collector. Because the voltage pulse derived on the collector continues for a time period after the disappearance of the input electrical waveform, it may be said that the saturation of the transistor acts to stretch the input electrical waveform.

In addition to the requirement of stretching, only a portion of the input electrical waveform may be of interest inasmuch as a relatively large amplitude electrical noise (a portion not of interest) may be adjacent and leading in time with respect to the desired signal. If the adjacent amplitude electrical noise operates to saturate the stretching transistor in a manner referred to above, the transistor will be ineffective to detect the presence or absence of the desired signal. In order to avoid this problem, the aforementioned stretching transistor may be strobed in time so it cannot be saturated until after the electrical noise has passed.

Referring to FIG. 1, there is shown a transistor T1 of the NPN type having a base 1, a collector 2 and an emitter 3, said transistor being connected to function as a stretching device in the manner described hereinabove and also to be strobed in time so that it cannot be saturated until after the large electrical noise has passed. As shown, emitter 3 of transistor T1 is connected to the emitter 4 of an on-off switching transistor T2 and to a +D.C. bias voltage through resistor 13. Transistor T2 is connected in a grounded collector configuration with its base 5 connected to receive a strobing voltage pulse at a point in time subsequent to the occurrence of the electrical noise in the input waveform being applied to base 1 of transistor T1. When transistor T2 is of the PNP type, as shown, the strobe input terminal should be connected to receive a negative going strobe pulse whenever strobing is desired. Normally, emitter 3 of transistor T1 is at the +D.C. bias voltage applied thereto through resistor 13. However, when a negative going strobe pulse is being applied to the base 5 of sufficient magnitude to forward bias that base-emitter junction, transistor T2 conducts and emitter 3 of transistor T1 goes to a ground voltage along with the emitter 4 of transistor T2. As described, transistor T2 operates as a switching device.

Referring to FIG. 2, there is shown an exemplary input electrical waveform A which may be applied to the base 1 of transistor T1 acting as a stretching device according to the teachings of the present invention. In the most difficult condition, input electrical waveform A may (as shown) be made up of adjacent, relative large amplitude, electrical noise having a waveform B and a desired signal waveform C of which it is desired to detect either the presence or absence. When the leading, large amplitude portion of waveform A is applied to base 1 of transistor T1, means must be provided to prevent its base-emitter junction from being sufficiently forwardly biased to cause saturation and the resultant minority carrier storage until the adjacent electrical noise has passed. As indicated above, transistor T2 performs this function by alternately maintaining emitter 3 at either a +D.C. bias voltage level applied thereto from a biasing source through biasing resistor 13 or at a ground voltage level, depending upon whether or not the base-emitter junction of PNP transistor T2 is forwardly biased by the strobing pulse.

In FIG. 2, the negative going strobe pulse is shown by waveform D. It should be noted that the leading edge of the negative going change in voltage levels should be selected to occur at a time when the contribution of electrical noise waveform B to input electrical waveform A is no longer significant. The width of the strobe pulse should be selected to be in accordance with the maximum amount of stretching which would ever be desired. Waveform E of FIG. 2 represents the derived voltage level of collector 2 and the stretched output voltage of stretching transistor T1. The output voltage waveform E has an amplitude which is determined in part by the voltage being applied to collector 2 and a width determined by the time which that transistor is maintained in saturation. Although a larger positive voltage is being supplied at terminal 15 via resistor 14, collector 2 can never rise above the biasing voltage level being applied to terminal 16 because of the clamping action of diode D1 connected therebetween. In summary, a selected portion of the input electrical waveform A is stretched by the action of minority carrier storage and amplified to a usable voltage level on collector 2.

Although the output voltage waveform E shown may be utilized directly, many known pulse type electrical systems exemplified by digital computers require the derivation of a pulse of a relatively narrow fixed width and fixed amplitude to correspond with the occurrence of a desired signal within the input waveform. Similarly, such an application requires no output pulse when the input electrical waveform does not contain the desired signal. To provide for this type of operation, collector 2 of transistor T1 is connected to one input of a conventional AND circuit which includes at least one other input for determining the output pulse width and the time at which the stretched signal is sampled. The stretched input voltage is applied via diode D2; and the other input, functionally labeled Read Pulse, is applied via terminal 19 and diode D3. As is conventional for negative going AND circuits, the output terminal 17 is connected to a −D.C. reference voltage through a resistor 20 so that each of diodes D2 and D3 are normally forwardly biased. When both of these diodes are simultaneously reversely biased by the negative going output pulse and the read pulse, an output pulse is derived at output terminal 17 corresponding in width to that of the read pulse. Waveform F of FIG. 2 is illustrative of the read pulse referred to above. It should be noted that the point in time at which the read pulse may occur may vary considerably as long as it coincides with the presence of the stretched output voltage waveform E on the collector 2 of transistor T1. This feature is particularly helpful in reducing the criticalness of the timing of logic pulses in pulse type electrical systems.

The input electrical waveform may be applied to the base of transistor T1 directly or via a transistor T3 connected in a grounded emitter configuration as shown hereinabove. When transistor T1 is of the NPN type, transistor T3 should also be of the NPN type and comprise a base 7, a collector 8 and an emitter 9. Emitter 9 is connected to ground through biasing resistor 10 and collector 8 is connected to receive a bias voltage through resistor 11. As a result, if an input electrical waveform, such as waveform A of FIG. 2, is applied to an input terminal 12, it will forwardly bias the base-emitter junction of transistor T3 and transmit the electrical input waveform to the base 1 of stretching device T1. If transistor T3 is properly selected, the input electrical waveform will not be sufficient to saturate transistor T3, and a faithful reproduction of this waveform will be applied to the base 1.

It should be noted that for effective operation, the + bias voltage being applied to terminal 16 should be selected in magnitude so that the voltage level of emitters 3 and 4 during the non-strobing condition will be sufficient to assure that the undesired portion of waveform A cannot forwardly bias transistor T1. Moreover, although strobing transistor T2 is shown in a grounded collector configuration, any equivalent electrical device might be substituted therefor.

Numerous modifications may be made to the circuit shown in FIG. 1 within the teachings of the present invention. For example, use of the emitter-follower stage comprising transistor T3 is optional, depending upon the need for providing a high impedance to the source of the input electrical waveform connected to terminal 12. Furthermore, the teachings of the present invention may be practiced without utilizing the AND circuit connected to the collector of transistor T1 whenever there is no need for a sampling or readout pulse of a fixed amplitude and width.

While the present invention is described herein as strobing, stretching and amplifying the desired signal portion of a relatively positive electrical waveform, it could well be utilized for strobing, stretching and amplifying a desired signal portion of a relatively negative electrical waveform by substituting equivalent PNP transistors for the NPN transistors T3 and T1 and an NPN transistor for the PNP transistor T2, reversing the diodes D1, D2 and D3 and reversing the polarity of the D.C. bias supply and reference voltages shown.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An electronic stroboscopic stretching amplifier device comprising a semi-conductor being connected to receive an input of an electrical signal having an electrical waveform which includes electrical noise and the desired electrical signal adjacent in time, switching means connected to said semi-conductor for rendering said semi-conductor operable during a strobing mode and ineffective during all other times, said electrical input waveform being sufficient to saturate said semi-conductor sufficient to cause carrier storage when said semi-conductor is effective and insufficient to saturate said semi-conductor at all other times, said semi-conductor deriving an output voltage pulse having a width which is a function of the time that said input electrical waveform maintains said semi-conductor in saturation.

2. An electronic stroboscopic stretching amplifier device comprising a semi-conductor being connected to receive an input of an electrical signal having an electrical waveform which includes electrical noise and the desired electrical signal adjacent in time, switching means connected to said semi-conductor for rendering said semi-conductor operable during a strobing mode and ineffective during all other times, said electrical input waveform being sufficient to saturate said semiconductor sufficient to cause carriage storage when said semi-conductor is effective and insufficient to saturate said semi-conductor at all other times, said semi-conductor deriving an output voltage pulse having a width which is a function of the time that said input electrical waveform maintains said semi-conductor in saturation, said switching means for strobing said semi-conductor being operative only during the portion of said electrical waveform containing the desired electrical signal.

3. An electronic stroboscopic stretching amplifier device comprising a semi-conductor being connected to receive an input of an electrical signal having an electrical waveform which includes electrical noise and the desired electrical signal adjacent in time, switching means connected to said semi-conductor for rendering said semi-conductor operable during a strobing mode and ineffective during all other times, said electrical input waveform being sufficient to saturate said semi-conductor sufficient to cause carrier storage when said semi-conductor is effective and insufficient to saturate said semi-conductor at all other times, said semi-conductor deriving an output voltage pulse having a width which is a function of the time that said input electrical waveform maintains said semi-conductor in saturation, and an AND circuit having one input responsive to said output of said semi-conductor having at least one other input arranged to be responsive to a read pulse, said switching means for strobing said semi-conductor being operative only during the portion of said electrical waveform containing the desired electrical signal.

4. An electronic stroboscopic stretch amplifier comprising an NPN transistor having a base, an emitter and a collector, said base being connected to receive an electrical signal having a relatively positive waveform with respect to ground which includes electrical noise and the desired electrical signal adjacent in time, said emitter being connected to be grounded during the strobing mode and having a relatively positive voltage applied thereto for back biasing the base-emitter junction during other times, said electrical input signal waveform being sufficient to saturate said transistor sufficient to cause carrier storage when said emitter is at ground voltage and insufficient to overcome said base-to-emitter back bias at other times, and said collector of said transistor having a positive going voltage pulse generated thereon having a width which is a function of the time that said input electrical waveform applied to said base maintains said transistor in saturation.

5. An electronic stroboscopic stretching amplifier comprising a transistor having a base, an emitter and a collector, said base being connected to receive an electrical signal having an electrical waveform which includes electrical noise and the desired electrical signal adjacent in time, means connected to said emitter for alternatively grounding said emitter during a strobing mode and for applying back biasing to said base-to-emitter junction during other times, said electrical input signal waveform being sufficient to saturate said transistor sufficient to cause carrier storage when said emitter is at ground voltage and insufficient to overcome said base-to-emitter back bias at other times, said collector of said transistor having an output voltage pulse generated thereon having a width which is a function of the time that said input electrical waveform applied to the base maintains said transistor in saturation.

6. An electronic stroboscopic stretching amplifier comprising a transistor having a base, an emitter and a collector, said base being connected to receive an electrical signal having an electrical waveform which includes electrical noise and the desired electrical signal adjacent in time, means connected to said emitter for alternatively grounding said emitter during a strobing mode and for applying back biasing to said base-to-emitter junction during other times, said electrical input signal waveform being sufficient to saturate said transistor sufficient to cause carrier storage when said emitter is at ground voltage and insufficient to overcome said base-to-emitter back bias at other times, said means for strobing said emitter being operative only during the portion of said electrical waveform containing the desired electrical signal.

7. An electronic stroboscopic stretch amplifier comprising a transistor having a base, an emitter and a collector, said base being connected to receive an electrical signal having an electrical waveform which includes electrical noise and the desired electrical signal adjacent in time, means connected to said emitter for alternatively grounding said emitter during a strobing mode and for applying back biasing to said base-to-emitter junction during other times, said electrical input signal waveform being sufficient to saturate said transistor sufficient to cause carrier storage when said emitter is at ground and insufficient to overcome said base-to-emitter back bias at other times, said collector of said transistor having a positive going voltage pulse generated thereon having a width which is a function of the time that said input electrical waveform applied to said base maintains said transistor in saturation, said means for strobing said emitter being operative only during the portion of said electrical waveform containing the desired electrical signal.

References Cited in the file of this patent

UNITED STATES PATENTS

| | | |
|---|---|---|
| 2,629,834 | Trent | Feb. 24, 1953 |
| 2,670,445 | Felker | Feb. 23, 1954 |
| 2,774,888 | Trousdale | Dec. 18, 1956 |
| 2,863,070 | Suran et al. | Dec. 2, 1958 |
| 2,866,105 | Eckert | Dec. 23, 1958 |
| 2,905,815 | Goodrich | Sept. 22, 1959 |

OTHER REFERENCES

Publication, "Junction Transistor Switching Circuits for High Speed Digital Computer Applications," by G. J. Prom and R. L. Crosby, Sylvania Electric Products, Inc., Electronic Systems Div., pages 5 and 6.